(12) United States Patent
Inaoka

(10) Patent No.: US 8,338,350 B2
(45) Date of Patent: Dec. 25, 2012

(54) GLUCONIC ACID CONTAINING PHOTORESIST CLEANING COMPOSITION FOR MULTI-METAL DEVICE PROCESSING

(75) Inventor: Seiji Inaoka, Nazareth, PA (US)

(73) Assignee: Avantor Performance Materials Inc., Phillipsburg, NJ (US)

( * ) Notice: Subject to any disclaimer, the term of this patent is extended or adjusted under 35 U.S.C. 154(b) by 85 days.

(21) Appl. No.: 12/998,499

(22) PCT Filed: Oct. 22, 2009

(86) PCT No.: PCT/US2009/061585
§ 371 (c)(1),
(2), (4) Date: Apr. 27, 2011

(87) PCT Pub. No.: WO2010/062508
PCT Pub. Date: Jun. 3, 2010

(65) Prior Publication Data
US 2011/0212865 A1 Sep. 1, 2011

Related U.S. Application Data

(60) Provisional application No. 61/108,942, filed on Oct. 28, 2008.

(51) Int. Cl.
*C11D 7/50* (2006.01)
(52) U.S. Cl. .......................... 510/175; 510/176; 134/1.3
(58) Field of Classification Search .................. 510/175, 510/176; 134/1.3
See application file for complete search history.

(56) References Cited

U.S. PATENT DOCUMENTS

| | | | |
|---|---|---|---|
| 5,071,582 A | 12/1991 | Conville et al. | 252/81 |
| 5,391,234 A | 2/1995 | Murphy | 134/38 |
| 5,989,353 A * | 11/1999 | Skee et al. | 134/2 |
| 6,268,323 B1 * | 7/2001 | Honda et al. | 510/176 |
| 6,372,050 B2 * | 4/2002 | Honda et al. | 134/3 |
| 6,569,261 B1 | 5/2003 | Aubay et al. | 134/39 |
| 6,635,118 B2 * | 10/2003 | Sachdev et al. | 134/1 |
| 6,703,358 B1 | 3/2004 | Aubay et al. | 510/434 |
| 6,773,873 B2 | 8/2004 | Seijo et al. | 430/329 |
| 6,887,597 B1 | 5/2005 | Yang et al. | 429/12 |
| 6,890,451 B2 | 5/2005 | Sapienza et al. | 252/70 |
| 7,247,208 B2 | 7/2007 | Hsu | 134/3 |
| 7,250,391 B2 | 7/2007 | Kanno et al. | 510/175 |
| 7,273,060 B2 | 9/2007 | Patel et al. | 134/1.3 |
| 7,399,365 B2 * | 7/2008 | Aoyama et al. | 134/2 |
| 7,456,140 B2 * | 11/2008 | Small et al. | 510/175 |
| 8,178,482 B2 * | 5/2012 | Kane | 510/175 |
| 2001/0001785 A1 | 5/2001 | Honda et al. | 510/175 |
| 2003/0130148 A1 | 7/2003 | Lee et al. | 510/175 |
| 2003/0130149 A1 * | 7/2003 | Zhou et al. | 510/176 |
| 2004/0025723 A1 | 2/2004 | Hanneman, Jr. et al. | 101/147 |
| 2004/0147421 A1 * | 7/2004 | Charm et al. | 510/176 |
| 2004/0149309 A1 * | 8/2004 | Hsu | 134/3 |
| 2004/0220065 A1 | 11/2004 | Hsu | 510/175 |
| 2005/0032657 A1 | 2/2005 | Kane et al. | 510/175 |
| 2005/0205835 A1 | 9/2005 | Tamboli et al. | 252/79.1 |
| 2006/0094612 A1 | 5/2006 | Kimura | 510/175 |
| 2006/0138399 A1 | 6/2006 | Itano et al. | 257/40 |
| 2006/0172907 A1 | 8/2006 | Kim et al. | 510/175 |
| 2006/0199749 A1 | 9/2006 | Suzuki et al. | 510/175 |
| 2007/0232511 A1 | 10/2007 | Fisher et al. | 510/175 |
| 2008/0045439 A1 | 2/2008 | Held | 510/488 |
| 2008/0051308 A1 * | 2/2008 | Kane | 510/176 |
| 2008/0103078 A1 * | 5/2008 | Inaoka | 510/176 |
| 2009/0212021 A1 | 8/2009 | Bernhard et al. | 216/109 |

FOREIGN PATENT DOCUMENTS

| | | |
|---|---|---|
| GB | 1 604 562 | 12/1981 |
| WO | WO 00/11091 | 3/2000 |
| WO | WO 2007/092800 | 8/2007 |

\* cited by examiner

*Primary Examiner* — Gregory Webb
(74) *Attorney, Agent, or Firm* — Hoffmann & Baron, LLP

(57) ABSTRACT

A microelectronic photoresist cleaning composition suitable for cleaning multi-metal microelectronic devices and to do so without any substantial or significant galvanic corrosion occurring when there is a subsequent rinsing step employing water.

13 Claims, No Drawings

GLUCONIC ACID CONTAINING PHOTORESIST CLEANING COMPOSITION FOR MULTI-METAL DEVICE PROCESSING

This application is the U.S. National Phase Application under 35 U.S.C. §371 of PCT Application No. PCT/US2009/061585, filed 22 Oct. 2009, and claiming priority from U.S. Provisional Application No. 61/108,942 filed 28 Oct. 2008.

FIELD OF THE INVENTION

This invention relates to a microelectronic photoresist cleaning composition suitable for cleaning multi-metal microelectronic devices and to do so without any substantial or significant galvanic corrosion occurring when there is a subsequent rinsing step employing water. The invention also relates to a method for cleaning such multi-metal microelectronic devices with the compositions of this invention.

BACKGROUND TO THE INVENTION

When many of the currently available alkaline based photoresist cleaning compositions are attempted to be used in cleaning multi-metal (e.g., Al/Mo or Al/Ti) microelectronic devices good cleaning does occur. However, when the following conventional water rising step is employed to remove the cleaning composition from the surfaces of the device there results an aqueous alkaline solution of generally pH 9 or higher that upon contact with the a multi-metal stack on the microelectronic device forms a galvanic current between the two or more dissimilar metals that produces and accelerates electrochemical (galvanic) corrosion. Thus, it has become necessary to have an "intermediate" rinse step employed, such as with a conventional solvent, normally isopropanol alcohol. This intermediate rinsing step is helpful in removing alkaline compounds in the cleaning composition from the microelectronic device before it comes into contact with water in the water rinse. This intermediate rinse step is just another additional process step that should be eliminated. Moreover, there is a need to provide a good cleaning composition for multi-metal microelectronic devices that produces good cleaning results while protecting the metals from galvanic corrosion.

SUMMARY OF THE INVENTION

In accordance with this invention there is provided a semi-aqueous, alkaline cleaning composition for cleaning a multi-metal microelectronic device, the composition consisting of:
(a) from about 10% to about 35% water;
(b) from about 5% to about 15% of at least one alkanolamine;
(c) from about 10% to about 50% solvent selected from the group consisting of N-methylpyrrolidinone or a mixture of N-methylpyrrolidinone and sulfolane;
(d) from about 2% to about 10% of gluconic acid or a compound producing gluconic acid by hydrolysis in water;
(e) from about 1% to about 8% of at least one oligoethylene glycol of the formula $HO(CH_2CH_2O)_nCH_2CH_2OH$ wherein n is 1 or more; and
(f) optionally from about 10% to about 40% of at least one diethylene glycol monoalkyl ether wherein the alkyl group contains from 1 to 4 carbon atoms;
wherein the percentages are weight percent based on the total weight of the composition and when the percentage of alkanolamine is equal to or less than 6% the amount of N-methyl pyrrolidinone solvent in the composition is 20% or more, and when the percentage of alkanolamine is 9% or more the amount on N-methylpyrrolidinone may be equal to or less than 20%. The cleaning compositions of this invention are particularly useful to clean multi-metal microelectronic devices and inhibiting galvanic corrosion of metal in the microelectronic device. The composition can be used at a temperature of from about 50° C. to about 60° C. to clean the microelectronic device without there being ay significant or substantial galvanic corrosion of the metal in the device.

DETAILED DESCRIPTION OF THE INVENTION

The semi-aqueous, alkaline cleaning compositions of this invention will have from about 10% to about 35% by weight water present in the composition. The water may be from water itself or as water that is part of an aqueous solution of another component of the composition, or a mixture from both sources. A preferred amount of water in the composition is about 10% to about 30%, more preferably about 15% to about 30%, and still more preferably about 18% to about 25% by weight.

The at least one alkanolamine may be any suitable alkanolamine, including alkanolamines of from 1 to 6, preferably 1 to 4, more preferably 1 to 3 carbon atoms. Especially preferred is mono isopropanol amine and diethanolamine. The amount of alkanolamine component present in the composition may be from about 5% to about 15%, preferably about 6% to about 10%, more particularly about 6% to about 8%, and still more particularly 6% to 7%.

The solvent(s) employed in the cleaning compositions of this invention are either N-methylpyrrolidinone or a mixture of N-methylpyrrolidinone and sulfolane. The solvent(s) will be present in the composition in an amount of from about 0% to about 20% sulfolane and from about 10% to about 30% N-methylpyrrolidinone. The total amount of solvent will be from about 10% to about 50%, preferably about 20% to about 50%, more preferably about 30% to about 50% and still more preferably about 30% to about 40%. In the compositions of this invention when the percentage of alkanolamine is equal to or less than 6% the amount of N-methylpyrrolidinone solvent in the composition is 20% or more and when the percentage of alkanolamine is 9% or more the amount on N-methylpyrrolidinone may be equal to or less than 20%.

Gluconic acid or a compounds producing Gluconic acid upon hydrolysis in water is employed as the galvanic corrosion inhibitor component of the composition. When gluconic acid is employed it is generally employed as a 50% aqueous solution, with the 50% water being part of the total amount of water permitted in the composition. As an example of a compound producing gluconic acid upon hydrolysis there may be mentioned gluconic acid δ-lactone. The total amount of gluconic acid in the composition as gluconic acid can be from about 25 to about 10%, preferably about 2% to about 6%, mote preferably about 3% to about 6%, and most preferably about 3%. Thus, when it is desired to have, for example, 3% gluconic acid in the composition 6% of a 50% aqueous solution of gluconic acid is employed.

While gluconic acid has been found to be an effective galvanic corrosion inhibitor in the cleaning compositions of this invention it has been discovered that gluconic acid is not highly miscible with organic solvents employed in the composition. At the time of preparation of the cleaning compositions of this invention there is sufficient water in the formulation and the miscibility is not a problem. However, water evaporates during use of the cleaning composition, particularly when the cleaning is conducted at a highly desirable temperature of from about 50° C. to about 60° C., a phase separation has been found to occur and the cleaning composition becomes cloudy. To overcome this problem and disadvantage it has been discovered that the composition has to have present at least one oligoethylene glycol component of the formula $HO(CH_2CH_2O)_nCH_2CH_2OH$ wherein n is 1 or more, preferably 1 to 4, present in the cleaning compositions of this invention. The presence of this component inhibits or prevents the phase separation from occurring and enables the cleaning compositions of this invention to maintain the galvanic corrosion inhibition property of the gluconic acid component. The oligoethylene glycol component is preferably diethylene glycol, triethylene glycol, and tetraethylene glycol. It is surprising that these oligoethylene glycol components are able to inhibit or prevent the afore-mentioned phase separation and decrease in galvanic corrosion inhibition in the compositions of this invention because ethylene glycol and glycerol do not possess this ability to inhibit or prevent the afore-mentioned phase separation and decrease in galvanic corrosion inhibition in the compositions of this invention. The at lest one oligoethylene glycol will be present in the composition in an amount of from about 1% to about 8%, preferably from about 2% to about 6%, more preferably about 3% to about 5%, and still more preferably about 5%.

Optionally the cleaning compositions of this invention will have present in the composition at least one diethylene glycol monoalkyl amine wherein the alkyl group contains from 1 to 4 carbon atoms. It there is at least one diethyleneglycol monoalkyl amine component present in the composition of this invention, and preferably such component is present, it will be present in an amount of from about 10% to about 40%, preferably about 10% to about 30%, more preferably about 20% to about 30%, and still more preferably about 25% to about 28%.

The cleaning compositions of his invention may be employed at any suitable cleaning temperature and time sufficient to clean the multi-metal microelectronic devices of photoresist and other residues, such as plasma and etch residue, but particularly able to be able to clean such multi-metal devices at a temperature of from about 50° C. to about 60° C. over a period of from about 30 to about 60 seconds and to do so while galvanic corrosion of the metal in the device is inhibited even when the cleaned device is subjected to a subsequent aqueous rinse.

The following Table 1 describes examples of cleaning compositions of this invention. In this Table 1 and following Table 2 the following abbreviations are employed. The percentages are percent by weight.

MIPA=Mono isopropanol amine
DEA=Diethanolamine
GLU=Gluconic acid-50% aqueous solution
δ-LAC=Gluconic acid δ-lactone
SFL=Sulfolane
NMP=N-Methyl pyrrolidinone
DEG=Diethylene glycol
EG=Ethylene glycol
TEG=Tetraethylene glycol
CAR=Carbitol (diethylene glycol monomethyl ether)
GLY=Glycerol

TABLE 1

| COMPOSITION | A | B | C | D | E | F | G | H | I |
|---|---|---|---|---|---|---|---|---|---|
| Water | 25 | 25 | 25 | 25 | 25 | 25 | 25 | 25 | 25 |
| MIPA | 6 | 6 | 6 | 6 | 9 | 9 | 9 | 9 | |
| DEA | | | | | | | | | 7 |
| SFL | 10 | 10 | 10 | 10 | 10 | 10 | 10 | 10 | |
| NMP | 20 | 20 | 20 | 20 | 15 | 15 | 20 | 20 | 40 |
| GLU | 6 | 6 | 6 | 6 | 6 | 6 | 6 | 6 | |
| δ-LAC | | | | | | | | | 5 |
| TEG | | 5 | | | | | | 5 | 3 |
| DEG | 5 | | 1 | 5 | 1 | 5 | 1 | | |
| CAR | 28 | 28 | 32 | 28 | 34 | 30 | 29 | 25 | 20 |

For evaluation of the above compositions A through I TFT glass microelectronic substrates with AL/Ti bimetal lines were employed. The substrates were processed is cleaning solutions at 50° C. to about 60° C. over a period of from about 30 to about 60 seconds. The cleaned substrates were then immersed in 55 solution of cleaner (95% water) for 1 to 3 minutes (to simulate the environment of water rinsing without any intermediate rinse) and then the magnitude of any galvanic corrosion was assessed. All the above compositions A through I thoroughly cleaned the substrate without any noticeable galvanic corrosion occurring and no cloudiness developing.

For comparison purposes the following comparative compositions AA through EE in Table 2 were formulated and subjected to the identical test conditions.

TABLE 2

| | COMPOSITION | | | | |
|---|---|---|---|---|---|
| | AA | BB | CC | DD | EE |
| Water | 25 | | | 25 | 25 | 25 |
| MIPA | 6 | 6 | 6 | 6 | 6 |
| SFL | 10 | 10 | 10 | 10 | 10 |
| NMP | 20 | 20 | 20 | 15 | 15 |
| GLU | 6 | 6 | 6 | 6 | 6 |
| TEG | | | | 1 | 5 |
| EG | | 5 | | | |
| GLY | | | 5 | | |
| CAR | 28 | 28 | 28 | 37 | 33 |

Composition AA without Gluconic acid has significant galvanic corrosion. Compositions BB and CC, identical to Inventive Composition A and B, except that ethylene glycol and glycerol were employed instead of tetraethylene glycol. These comparative compositions BB and CC developed undesirable cloudiness and experienced phase separation of the gluconic acid. Comparative compositions DD and EE both developed noticeable cloudiness lading to phase separation. The combination of low (6%) MIPA and low (15%) NMP in said comparative compositions produced such results whereas similar compositions of this invention wherein the percentage of alkanolamine (MIPA) is equal to or less than 6% and the amount of NMP solvent in the composition is 20% or more or when the percentage of alkanolamine (MIPA) is 9% or more the amount on NMP is equal to or less than 20% then such cloudiness and phase separation does not occur. Thus either the MIPA or NMP solvent must be in the high range of their concentration in the compositions of this invention, i.e., when the percentage of alkanolamine is equal to or less than 6% the amount of N-methylpyrrolidinone solvent in the composition is 20% or more and when the percentage of alkanolamine is 9% or more the amount on N-methylpyrrolidinone may be equal to or less than 20%.

While the invention has been described herein with reference to the specific embodiments thereof, it will be appreciated that changes, modification and variations can be made without departing from the spirit and scope of the inventive concept disclosed herein. Accordingly, it is intended to embrace all such changes, modification and variations that fall with the spirit and scope of the appended claims.

The invention claimed is:

1. A semi-aqueous, alkaline cleaning composition for cleaning a multi-metal microelectronic device, the composition consisting of:
   (a) from about 10% to about 35% water;
   (b) from about 5% to about 15% of at least one alkanolamine;
   (c) from about 10% to about 50% solvent selected from the group consisting of N-methylpyrrolidinone or a mixture of N-methylpyrrolidinone and sulfolane;
   (d) from about 2% to about 10% of gluconic acid or a compound producing gluconic acid by hydrolysis in water;
   (e) from about 1% to about 8% of at least one oligoethylene glycol of the formula $HO(CH_2CH_2O)_nCH_2CH_2OH$ wherein n is 1 or more; and
   (f) optionally from about 10% to about 40% of at least one diethylene glycol monoalkyl ether wherein the alkyl group contains from 1 to 4 carbon atoms;
   wherein the percentages are weight percent based on the total weight of the composition and when the percentage of alkanolamine is equal to or less than 6% the amount of N-methylpyrrolidinone solvent in the composition is 20% or more, and when the percentage of alkanolamine is 9% or more the amount on N-methyl pyrrolidinone may be equal to or less than 20%.

2. A semi-aqueous, alkaline cleaning composition of claim 1 consisting of
   (a) from about 10% to about 30% water;
   (b) from about 6% to about 10% of at least one alkanolamine;
   (c) from about 20% to about 50% of solvent;
   (d) from about 2% to about 6% of gluconic acid or compound producing gluconic acid by hydrolysis in water;
   (e) from about 2% to about 6% oligoethylene glycol of the formula $HO(CH_2CH_2O)_nCH_2CH_2OH$ wherein n is 1, 2, 3 or 4; and
   (f) from about 20% to about 30% of at least one diethylene glycol monoalkyl ether.

3. A semi-aqueous, alkaline cleaning composition of claim 2 wherein:
   the alkanolamine consists of mono isopropanol amine;
   the oligoethylene glycol consists of tetraethylene glycol; and
   the diethylene glycol monoalkyl ether consists of diethylene glycol monomethyl ether.

4. A semi-aqueous, alkaline cleaning composition of claim 2 consisting of
   15% to 30% water;
   6% to 8% mono isopropanol amine;
   from 10% to 30% N-methylpyrrolidinone and 0% to 20% sulfolane;
   2% to 6% gluconic acid;
   3% to 5% oligoethylene glycol; and
   20% to 30% diethylene glycol monomethyl ether.

5. A semi-aqueous, alkaline cleaning composition of claim 1 consisting of
   about 28% water;
   about 6% mono isopropanol amine;
   about 10% sulfolane and 20% N-methylpyrrolidinone;
   about 3% gluconic acid;
   about 5% tetraethylene glycol; and
   about 28% diethyleneglycol monomethyl ether.

6. A semi-aqueous, alkaline cleaning composition of claim 1 consisting of
   about 25% water;
   about 7% diethanolamine;
   about 40% N-methylpyrrolidinone;
   about 5% gluconic acid δ-lactone;
   about 3% tetraethylene glycol; and
   about 20% diethylene glycol monomethyl ether.

7. A process for cleaning a multi-metal microelectronic device comprising contacting the device with a cleaning composition of claim 1 for a time and at a temperature to accomplish the cleaning of the device.

8. The process according to claim 7 wherein the cleaning is conducted at a temperature of about 50° C. to about 60° C.

9. A process for cleaning a multi-metal microelectronic device comprising contacting the device with a cleaning composition of claim 2 for a time and at a temperature to accomplish the cleaning of the device.

10. A process for cleaning a multi-metal microelectronic device comprising contacting the device with a cleaning composition of claim 3 for a time and at a temperature to accomplish the cleaning of the device.

11. A process for cleaning a multi-metal microelectronic device comprising contacting the device with a cleaning composition of claim 4 for a time and at a temperature to accomplish the cleaning of the device.

12. A process for cleaning a multi-metal microelectronic device comprising contacting the device with a cleaning composition of claim 5 for a time and at a temperature to accomplish the cleaning of the device.

13. A process for cleaning a multi-metal microelectronic device comprising contacting the device with a cleaning composition of claim 6 for a time and at a temperature to accomplish the cleaning of the device.

* * * * *

UNITED STATES PATENT AND TRADEMARK OFFICE
CERTIFICATE OF CORRECTION

PATENT NO. : 8,338,350 B2
APPLICATION NO. : 12/998499
DATED : December 25, 2012
INVENTOR(S) : Seiji Inaoka It is certified that error appears in the above-identified patent and that said Letters Patent is hereby corrected as shown below:

IN THE SPECIFICATION:

Column 2, line 55:

Now reads: "mote preferably"

Should read: -- more preferably --

Column 3, line 21:

Now reads: "The at lest one"

Should read: -- The at least one --

Column 3, lines 28:

Now reads: "It there is"

Should read: -- If there is --

Column 3, line 35:

Now reads: "of his invention"

Should read: -- of this invention --

Signed and Sealed this
Thirteenth Day of August, 2013

Teresa Stanek Rea
*Acting Director of the United States Patent and Trademark Office*

Column 4, line 14:

Now reads: "processed is cleaning"

Should read: -- processed in cleaning --

Column 4, line 49:

Now reads: "cloudiness lading to"

Should read: -- cloudiness leading to --